United States Patent
Park et al.

(10) Patent No.: US 10,809,552 B2
(45) Date of Patent: Oct. 20, 2020

(54) SUPPORT STRUCTURE OF DISPLAY DEVICE

(71) Applicant: LG Display Co., Ltd., Seoul (KR)

(72) Inventors: Kyung-Jae Park, Incheon (KR); Choun-Sung Kang, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/201,843

(22) Filed: Nov. 27, 2018

(65) Prior Publication Data
US 2019/0174640 A1      Jun. 6, 2019

(30) Foreign Application Priority Data
Dec. 4, 2017   (KR) .................. 10-2017-0165409

(51) Int. Cl.
| | |
|---|---|
| *H05K 5/00* | (2006.01) |
| *G02F 1/1333* | (2006.01) |
| *H01L 51/00* | (2006.01) |
| *H05K 5/02* | (2006.01) |
| *G02F 1/13* | (2006.01) |
| *H01L 51/52* | (2006.01) |
| *H01L 27/32* | (2006.01) |

(52) U.S. Cl.
CPC .......... *G02F 1/133305* (2013.01); *G02F 1/13* (2013.01); *H01L 51/0097* (2013.01); *H05K 5/0017* (2013.01); *H05K 5/0217* (2013.01); *H01L 27/3244* (2013.01); *H01L 51/5237* (2013.01); *H01L 2251/5338* (2013.01)

(58) Field of Classification Search
CPC ...... H05K 5/0017; H05K 5/0217; G02F 1/13; G02F 2001/133328; G02F 2001/133314; G02F 1/133308; G02F 1/133305; G02F 2201/503; H01L 51/0097; H01L 27/3244; H01L 51/5237; H01L 2251/5338; G06F 1/1652; G06F 1/1681; G06F 1/1616; G06F 1/1641
See application file for complete search history.

(56) References Cited

U.S. PATENT DOCUMENTS

| | | | |
|---|---|---|---|
| 7,791,279 B2* | 9/2010 | Kwon | H01J 5/48 313/582 |
| 2015/0055287 A1* | 2/2015 | Seo | G06F 1/1652 361/679.27 |

* cited by examiner

*Primary Examiner* — James Wu
(74) *Attorney, Agent, or Firm* — Seed IP Law Group LLP

(57) ABSTRACT

A display device is disclosed. The display device includes a plurality of support units disposed side by side on the rear surface of a flexible display panel, a resin unit, which is made of a resin, for elastically interconnecting the support units, and a restoration unit protruding from each support unit for interfering with the resin unit, which stretches when the display panel is bent, in order to restore the display panel to the original state thereof. The support units may be integrally formed with the resin unit in order to maintain the flatness of the display panel. In addition, when impact is applied to the display panel, the support units may distribute the impact to the periphery of the display panel, thereby preventing damage to the display panel.

13 Claims, 8 Drawing Sheets
(2 of 8 Drawing Sheet(s) Filed in Color)

SUPPORT STRUCTURE OF DISPLAY DEVICE

CROSS-REFERENCE TO RELATED APPLICATION

This application claims the benefit of Korean Patent Application No. 10-2017-0165409, filed on Dec. 4, 2017, which is hereby incorporated by reference as if fully set forth herein.

BACKGROUND

Technical Field

The present disclosure relates to a rollable display device configured such that a flexible display panel can be bent or wound.

Description of the Related Art

Recently, in the information-oriented society, the importance of display devices as a visual information transmission medium has been further emphasized. In order to occupy important positions in the future, requirements such as low power consumption, slimness, reduced weight, and high image quality must be satisfied.

Display devices may be classified into self-emissive display devices, such as a cathode ray tube (CRT) display device, an electro-luminescent (EL) display device, a light-emitting diode (LED) display device, a vacuum fluorescent display (VFD) device, a field emission display (FED) device, and a plasma display panel (PDP), and non-emissive display devices, such as a liquid crystal display (LCD) device.

Conventional flat display panels have limited applications and usages, since a glass substrate, which is not flexible, is used. In recent years, therefore, a rollable display device that is capable of being bent through the use of a flexible substrate, such as plastic, instead of the glass substrate, has attracted considerable attention as a new type of display. In particular, research has been actively conducted into a rollable display device that enables a flexible display panel to be rolled up in order to improve portability thereof.

FIG. 1 is a reference view showing the case in which impact is applied to a conventional rollable display device, FIG. 2 is a reference view showing the surface of the rollable display device of FIG. 1, and FIG. 3 is a reference view showing the analysis of the amount of impact applied to the rollable display device of FIG. 1.

Referring to FIGS. 1 to 3, a conventional rollable display device 1 includes a polarizer plate (not shown), a display panel 2, an adhesive layer (not shown), and a plurality of support bars 3.

In the rollable display device 1, the support bars 3, each of which has a sectional shape of a quadrangle, are provided side by side at the rear surface of the display panel 2 in order to support the display panel 2 in a flat state, thereby preventing a screen from being irregularly bent. In addition, when impact is applied to the upper part of the display panel 2, the support bars 3 transmit the impact to the periphery of the display panel 2 in order to prevent damage to the display panel 2.

In the conventional rollable display device 1, however, it is difficult to maintain the flatness of the display panel, since the support bars 3 are independently coupled to the rear surface of the display panel 2. In addition, when impact is applied to the display panel 2, the impact is concentrated on only some of the support bars 3.

It can be seen from FIG. 3 that the value at the point to which the greatest impact is applied is about 560 MPa and that stress is not uniformly distributed from the point to which the greatest impact is applied but is concentrated on a specific point. As a result, it is not possible to distribute the impact, which damages the display panel 2.

BRIEF SUMMARY

Accordingly, the present disclosure is directed to a display device that substantially obviates one or more problems due to the limitations and disadvantages of the related art.

An object of the present disclosure is to provide a display device that is capable of securing the flatness of a display panel when the display panel is bent or restored.

Another object of the present disclosure is to provide a display device that is capable of enabling the rear surface of a flexible display panel to be securely supported and providing restoring force such that the display panel can be easily restored to the original state thereof.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a plurality of support units disposed side by side on the rear surface of a flexible display panel, a resin unit, which is made of a resin, for elastically interconnecting the support units, and a restoration unit protruding from each support unit for interfering with the resin unit, which stretches when the display panel is bent, in order to restore the display panel to the original state thereof.

The support units may be integrally formed with the resin unit in order to maintain the flatness of the display panel. In addition, when impact is applied to the display panel, the support units may distribute the impact to the periphery of the display panel, thereby preventing damage to the display panel.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The application file contains at least one drawing executed in color. Copies of the color drawings will be provided by the Office upon request and payment of the necessary fee. The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
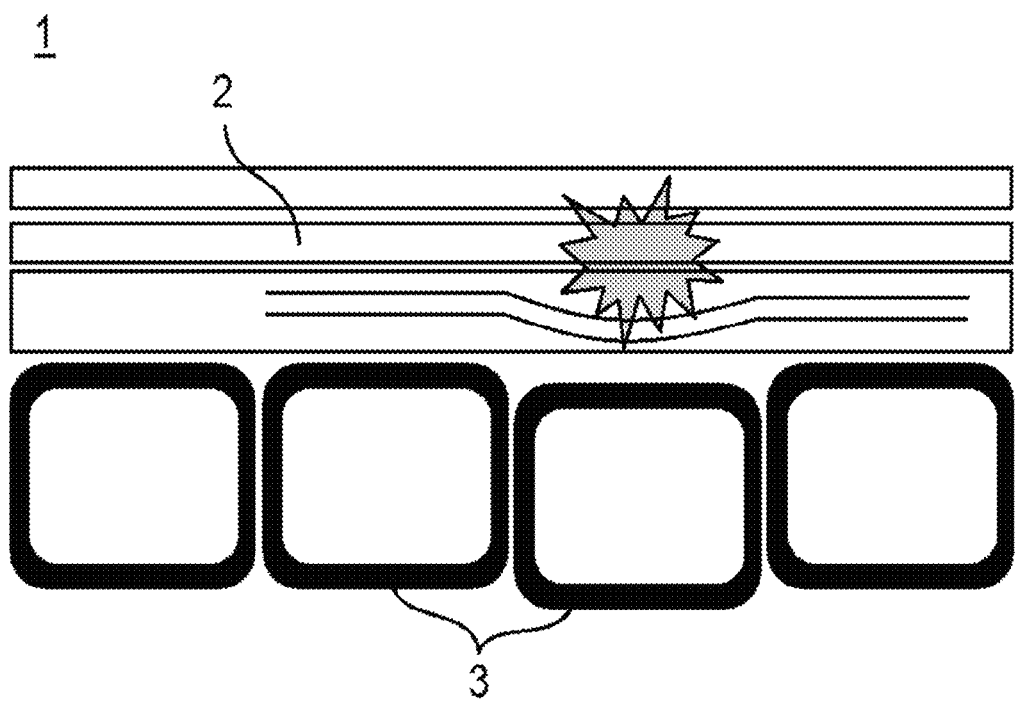
FIG. 1 is a reference view showing the case in which impact is applied to a conventional rollable display device.
Figure 2:
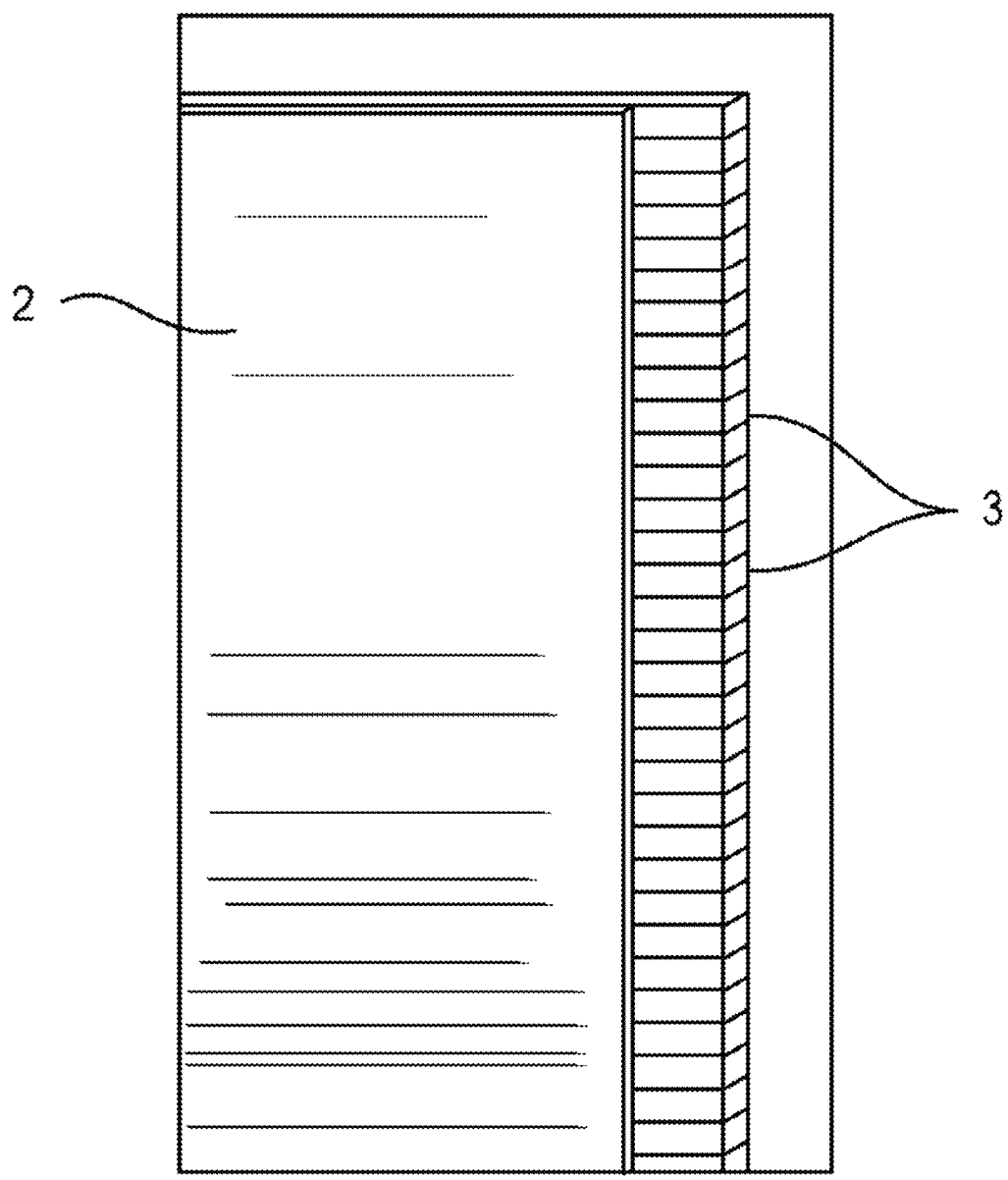
FIG. 2 is a reference view showing the surface of the rollable display device of FIG. 1.
Figure 3:
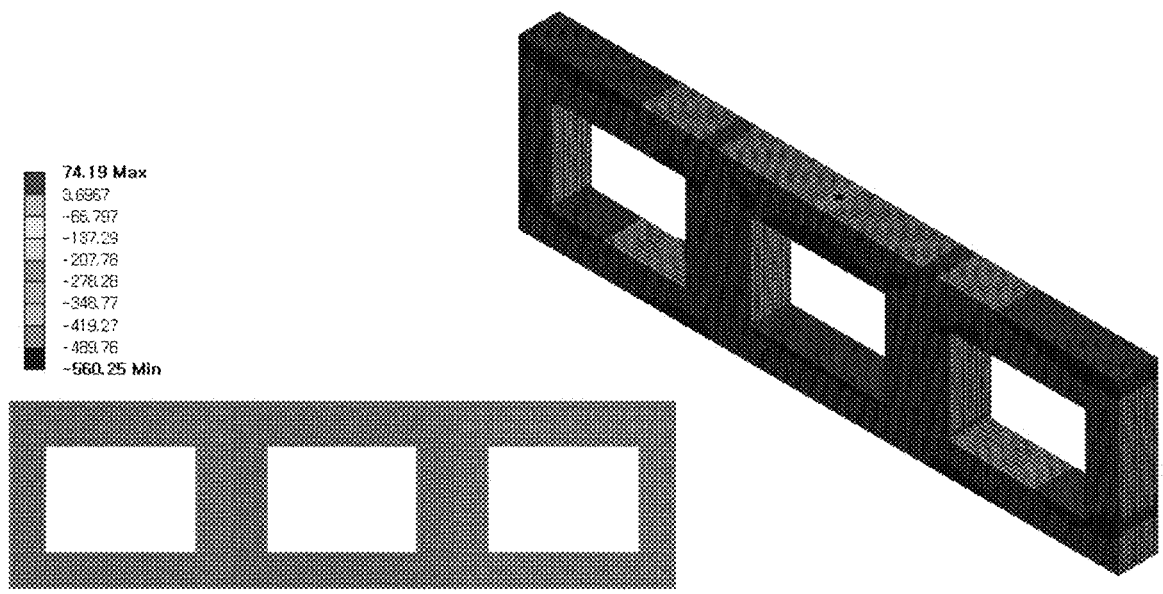
FIG. 3 is a reference view showing the analysis of the amount of impact applied to the rollable display device of FIG. 1.

Hereinafter, exemplary embodiments of an organic light-emitting display device according to the present disclosure will be described in detail with reference to the accompanying drawings so that the present disclosure will be easily realized by those skilled in the art. In the drawings, the same elements are denoted by the same reference numerals even when they are depicted in different drawings. In the following description of the present disclosure, a detailed description of known functions and configurations incorporated herein will be omitted when the same may obscure the subject matter of the present disclosure. Those skilled in the art will appreciate that some features in the drawings may be exaggerated, reduced, or simplified for ease of description thereof, and that the drawings and elements therein are not always shown at the actual scale.

Figure 4:
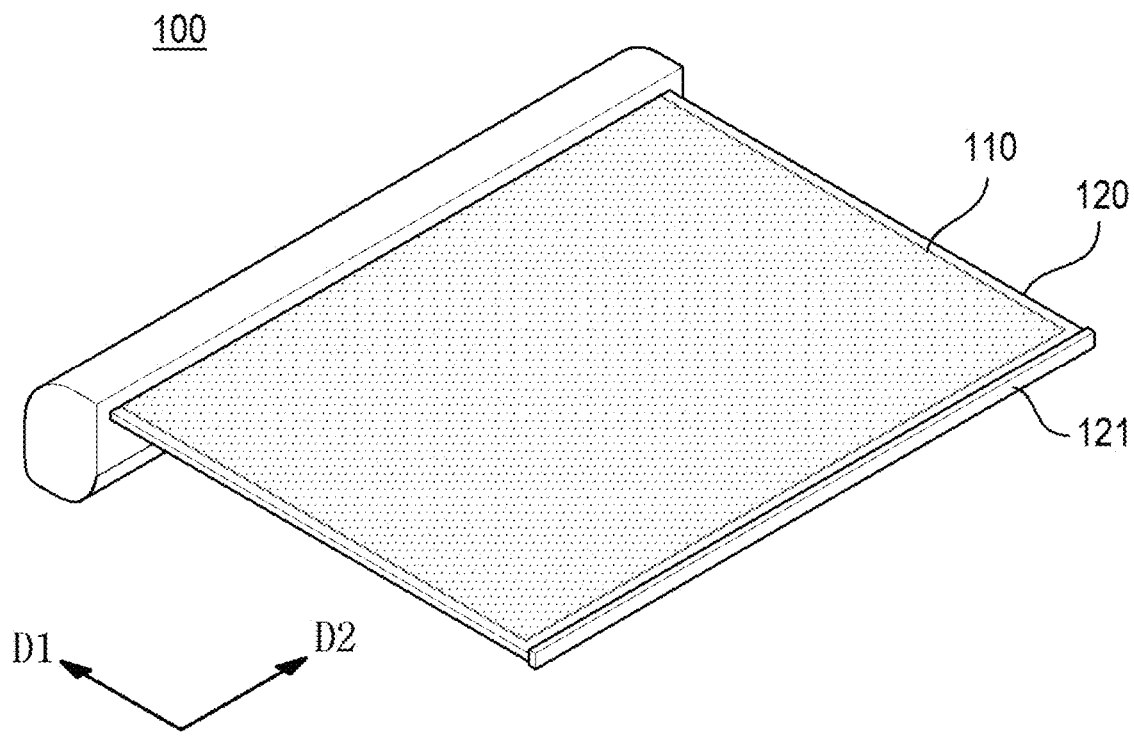
FIG. 4 is a perspective view showing a display device according to a first embodiment of the present disclosure.
Figure 5:
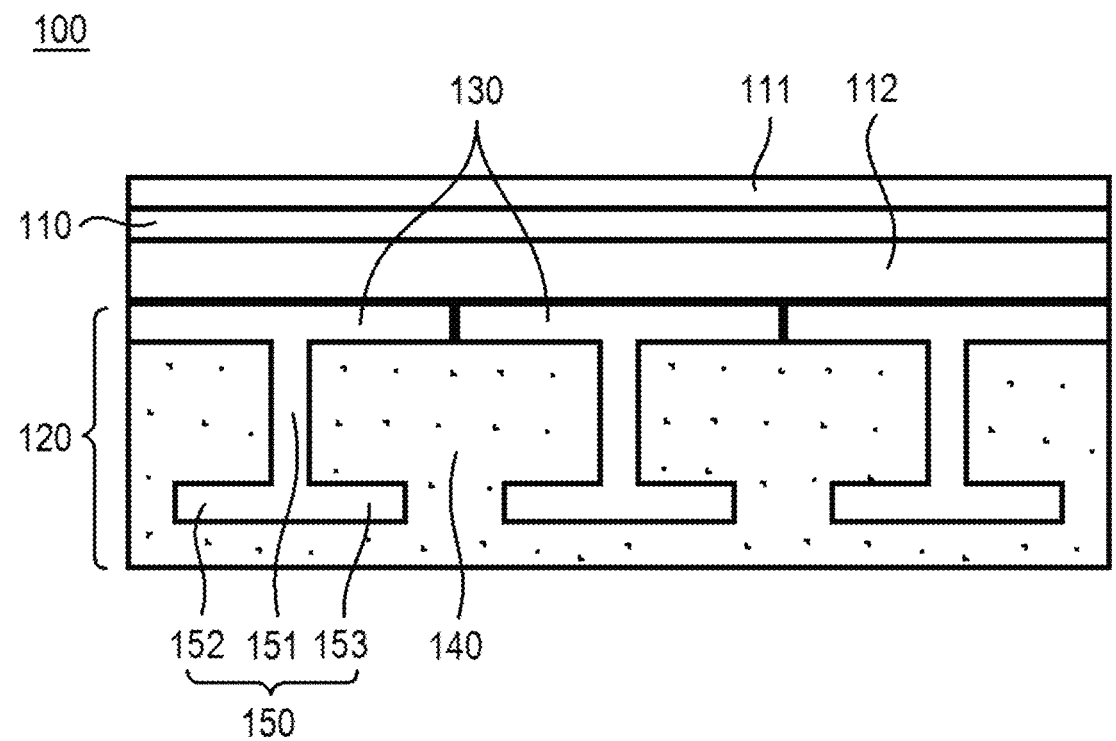
FIG. 5 is a sectional view of the display device shown in FIG. 4.
Figure 6:
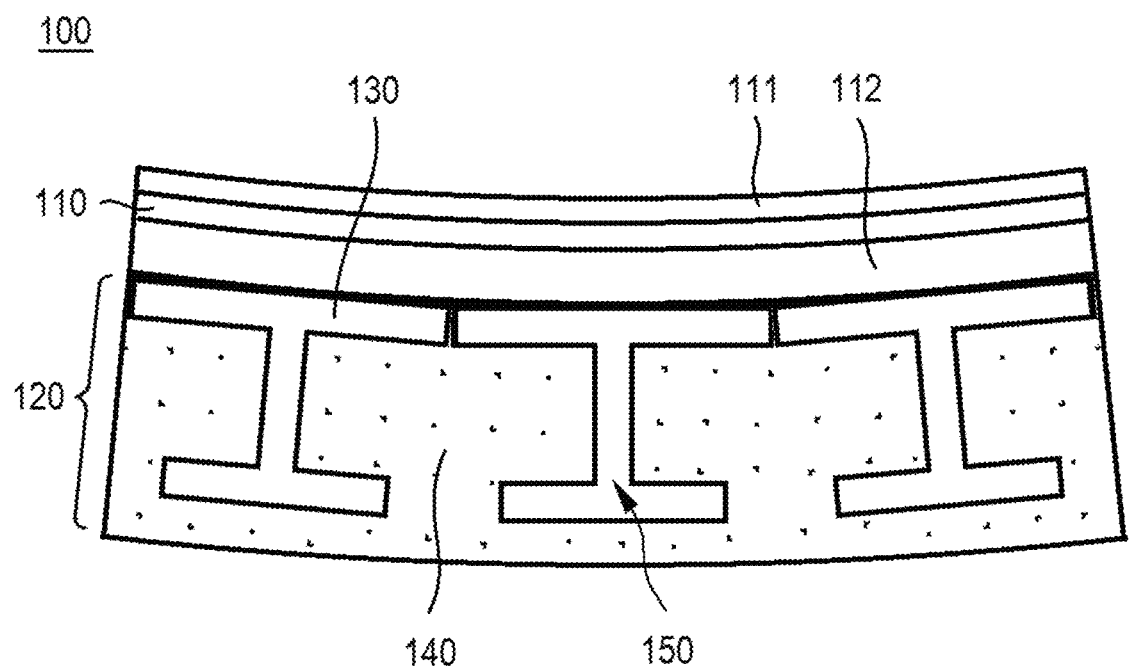
FIG. 6 is a sectional view showing the state in which the display device shown in FIG. 5 is bent.
Figure 7:
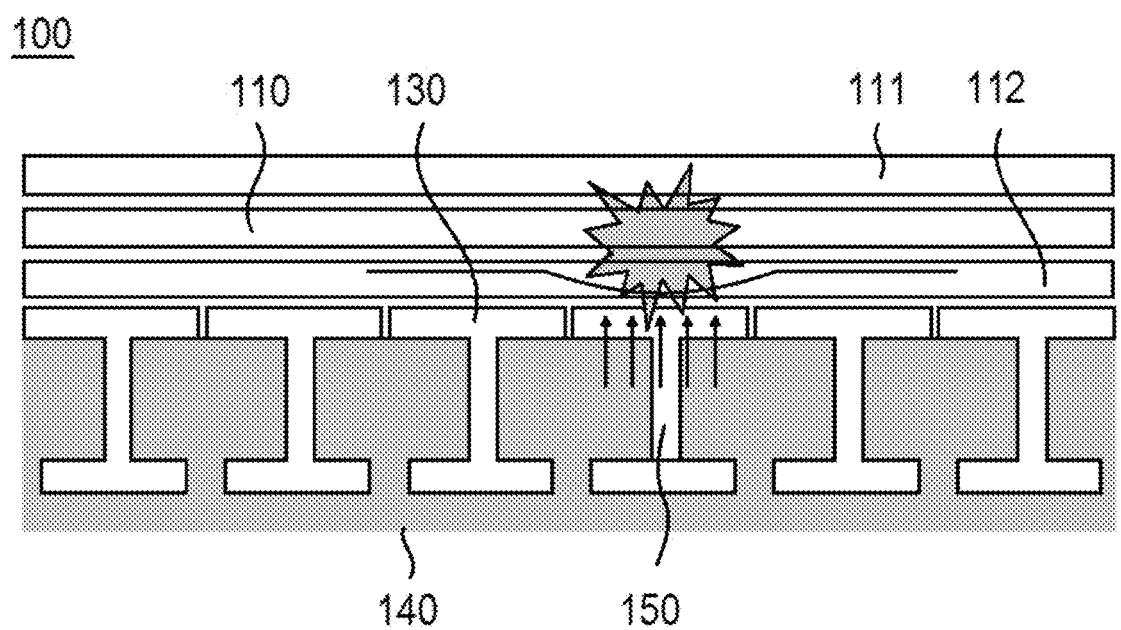
FIG. 7 is a reference view showing the state in which impact is applied to the display device shown in FIG. 5.
Figure 8:
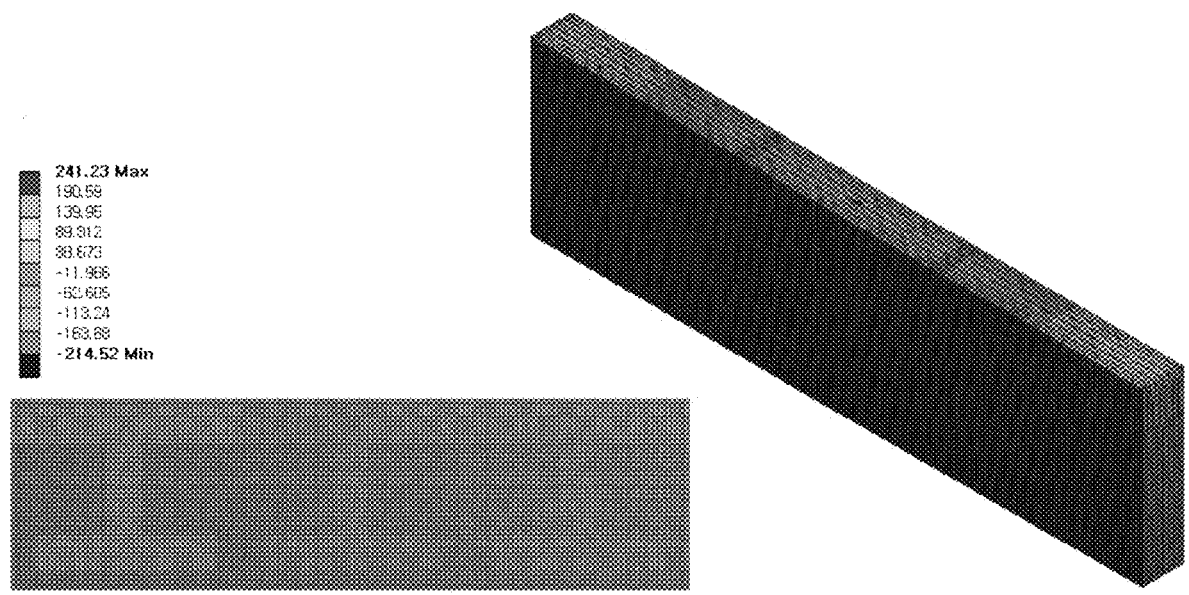
FIG. 8 is a reference view showing the analysis of the amount of impact applied to the display device shown in FIG. 7.

FIG. 4 is a perspective view showing a display device according to a first embodiment of the present disclosure, FIG. 5 is a sectional view of the display device shown in FIG. 4, FIG. 6 is a sectional view showing the state in which the display device shown in FIG. 5 is bent, FIG. 7 is a reference view showing the state in which impact is applied to the display device shown in FIG. 5, and FIG. 8 is a reference view showing the analysis of the amount of impact applied to the display device shown in FIG. 7.

Referring to FIGS. 4 to 8, a display device 100 according to a first embodiment of the present disclosure includes a support structure 120 coupled to the rear surface of a flexible display panel 110 for uniformly maintaining the flatness of the flexible display panel 110. The support structure 120 includes a plurality of support units 130, a resin unit 140 for elastically interconnecting the support units 130, and a restoration unit 150 protruding from each support unit 130 for guiding the restoration of the resin unit 140 to restore the display panel 110 to the original position thereof in the state in which the display panel 110 is bent.

In the following description, the display panel is a flexible display panel that can be bent or curved in at least one direction.

In particular, the flexible display panel 110 is applied to a rollable display device 100 configured such that the flexible display panel 110 is received in the state of being wound on a roller (not shown) and is unwound from the roller so as to be unrolled in the form of a flat display panel in order to display an image. A flexible organic light-emitting display panel using a flexible substrate may be used as one example of the flexible display panel 110. In this case, one side of the flexible display panel 110 is connected to a drive circuit (not shown), and a handle 121 configured to be held and pulled by a user is provided at the other side of the flexible display panel 110.

In the case in which a thin film transistor array substrate is used, the flexible display panel 110 includes a pixel array unit, an encapsulation layer, and a pad unit. The pixel array unit includes a plurality of pixels having organic light-emitting devices provided at pixel areas defined by pixel-driving lines, including gate lines and data lines, for displaying an image according to a signal supplied to the pixel-driving lines. The encapsulation layer is provided to prevent the penetration of moisture into each pixel to protect the organic light-emitting device from being damaged. The encapsulation layer is configured to cover the pixel array unit. A gate-driving circuit (not shown) for supplying a gate signal (or a scan signal) to the gate lines is provided in the vertical non-display area of the flexible substrate. The gate-driving circuit is formed during the process of manufacturing a thin film transistor of each pixel so as to be connected to each gate line.

In addition, in the case in which the flexible display panel 110 is a flexible organic light-emitting display panel, the flexible display panel 110 includes an upper polarizer film 111 attached to the upper surface thereof. However, the upper polarizer film 111 may be omitted in order to maintain the flexibility of the flexible display panel 110. A very thin metal plate may be attached to the rear surface of the flexible substrate. The metal plate may be made of an invar material.

In addition, the display device 100 may further include a touchscreen (not shown) that provides an interface for user touch. The touchscreen may be attached to the flexible display panel 110, may be mounted in the flexible display panel 110 during the process of forming the pixel array unit according to an in-cell touch scheme, or may be provided through a patterning process.

The pad unit is provided at the edge of one side of the flexible display panel 110 so as to be individually connected to each of the pixel-driving lines provided at the pixel array unit. The pad unit is connected to a panel-driving circuit unit received in the roller. The pad unit connects the flexible display panel 110 and the panel-driving circuit unit such that the display area of the flexible display panel 110 is withdrawn from a housing. For example, in the case in which the flexible display panel 110 is completely unwound from the roller, the pad unit may have a particular length from the roller to the housing. Therefore, when the flexible display panel 110 is completely unwound from the roller, the entire display area of the flexible display panel 110 may be withdrawn from the housing.

The roller functions to wind or unwind the flexible display panel 110. The roller may be coupled to the edge of the side of the flexible display panel 110 that overlaps the pad unit.

At the rear surface of the flexible display panel 110 is provided a support structure for uniformly maintaining the flatness of the flexible display panel 110, absorbing and distributing impact applied to the flexible display panel 110, and uniformly maintaining the flatness of the flexible display panel 110 in the state in which the flexible display panel 110 is flat when withdrawn from the housing in the state of being wound on the roller in the rollable display device 110. The flexible display panel 110 may be configured to have an inner-folding type structure, in which the flexible display panel 110 is bent such that the display area thereof is located inside, or an outer-folding type structure, in which the flexible display panel 110 is bent such that the display area thereof is located outside. In the present disclosure, an inner-folding type flexible display panel is described by way of example.

As shown in FIG. 5, one side of a double-sided adhesive layer 112 is attached to the rear surface of the flexible display panel 110, and the support units 130 are attached to the other side of the adhesive layer 112. The support units 130 are formed by dual injection molding together with the resin unit 140, which is made of resin. A restoration unit 150, which protrudes toward the resin unit 140 so as to have a sectional shape of a "T", is provided in the middle of the rear surface of each support unit 130. The restoration unit 150 includes a protruding member 151 protruding from the support unit 130, a first bent member 152 disposed at one side of the end of the protruding member 151, and a second bent member 153 disposed at the other side of the end of the protruding member 151. The first bent member 152 and the second bent member 153 have the same length such that each support unit 130 and a corresponding restoration unit 150 are disposed so as to have a sectional shape of an "H".

When the flexible display panel 110 is bent, the protruding member 151, the first bent member 152, and the second bent member 153 interfere with the resin unit 140 to provide restoring force for restoring the flexible display panel 110 to the original position thereof. In other words, the resin unit 140 and the restoration units 150, which are located outside the flexible display panel 110, have greater bending variation than the flexible display panel 110. Consequently, the restoration units 150 are disposed in the resin unit 140 at intervals such that the restoring force of the resin unit 140 is uniformly applied to the flexible display panel 110 or the support units 130, whereby the flexible display panel 110 is easily restored to the original position thereof.

When the flexible display panel 110 is bent, as shown in FIG. 6, the support units 130 are bent in the state of being spaced apart from each other and of being attached to the rear surface of the flexible display panel 110. Since the resin unit 140 is integrally formed with the support units 130, the force of coupling between the supports is maintained. In addition, the bent state of the flexible display panel 110 is restored due to interference of the protruding members 151 with the resin unit 140 and inherent elasticity of the resin unit 140.

In other words, the protruding members 151, which are spaced further apart from the flexible display panel 110 than the support units 130, are bent further than the flexible display panel 110. At this time, the interference of the protruding members 151 with the resin unit 140 is increased, thereby guiding the restoration of the flexible display panel 110.

The resin unit 140 may be made of a synthetic resin, such as an epoxy resin or an urethane resin, or a silicone or the like.

The flexible display panel 110 is bent such that the display area thereof is located inside. At this time, the support units 130 are arranged side by side along the bent flexible display panel 110. That is, the support units 130 are attached to the rear surface of the flexible display panel 110 in the state of being in tight contact side by side along the longitudinal direction of the bent flexible display panel 110. Even when impact is applied to the upper surface of the flexible display panel 110, therefore, the impact is easily transmitted to some of the support units 130 and is also distributed to the other support units 130, whereby damage to the flexible display panel 110 is prevented.

One of the support units 130 to which the greatest impact is applied is not independently spaced apart from the other support units 130 on the rear surface of the flexible display panel 110, but supports the flexible display panel 110 while distributing the impact together with the other supports in the vicinity thereof, whereby the flatness of the flexible display panel 110 may be maintained uniformly, and damage to the flexible display panel 110 may be prevented. It can be seen from FIG. 8 that the value at the point to which the greatest impact is applied is about 214 MPa and that stress is uniformly distributed from the point to which the greatest impact is applied.

Figure 9:
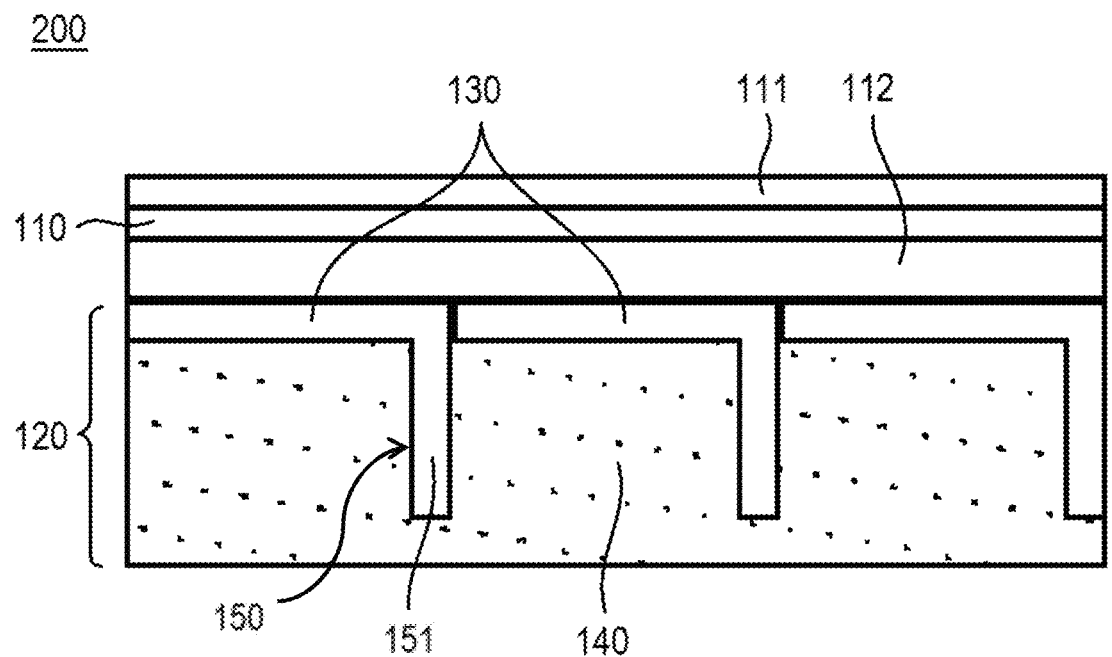
FIG. 9 is a sectional view showing a display device according to a second embodiment of the present disclosure.

FIG. 9 is a sectional view showing a display device according to a second embodiment of the present disclosure. The same reference numerals as the reference numerals used above refer to the same parts.

Referring to FIG. 9, a display device 200 according to a second embodiment of the present disclosure is configured such that support units 130 are provided at the rear surface of a flexible display panel 110 and such that a restoration unit 150 is disposed at one end of each support unit 130. The support units 130 and the restoration units 150 are formed by dual injection molding together with a resin unit 140.

Each support unit 130 and a corresponding restoration unit 150 are disposed so as to have a sectional shape approximating an "L". Of course, the position at which a protruding member 151 protrudes from the support unit 130 may be changed depending on the direction in which the flexible display panel 110 is bent.

Figure 10:
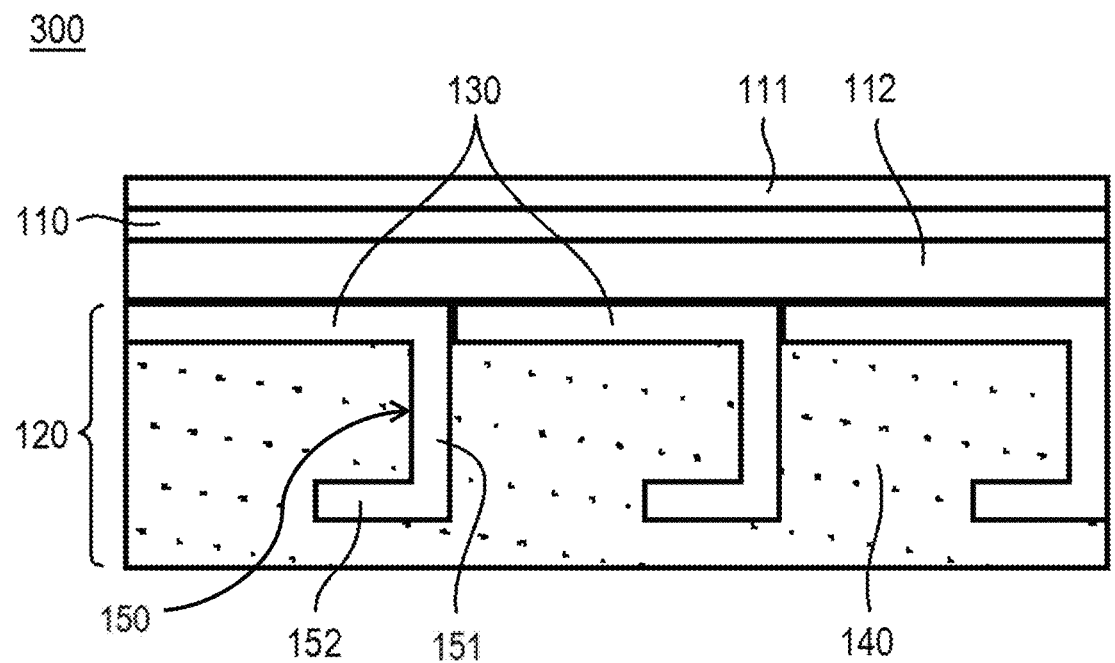
FIG. 10 is a sectional view showing a display device according to a third embodiment of the present disclosure.

FIG. 10 is a sectional view showing a display device according to a third embodiment of the present disclosure.

Referring to FIG. 10, a display device 300 according to a third embodiment of the present disclosure is configured such that support units 130 are provided at the rear surface of a flexible display panel 110 and such that a restoration unit 150 protrudes from one end of each support unit 130. The support units 130 and the restoration units 150 are formed by dual injection molding together with a resin unit 140.

Each restoration unit 150 includes a protruding member 151 protruding from a corresponding one of the support units 130 and a first bent member 152 bent from the end of the protruding member 151 toward one side.

Interference of the first bent member 152 with the resin unit 140 as well as the protruding member 151 is increased, whereby the force of restoring the flexible display panel 110 in the bent state thereof is increased. In addition, each restoration unit 150 may further include a second bent member 153 (see FIG. 13) provided at the other side of the protruding member 151 so as to be opposite the first bent member 152. In the case in which the first bent member 152 and the second bent member 153 are disposed along the same line, the support units 130 and the restoration unit 150 may be disposed so as to have a sectional shape of an "H", as in the display device according to the first embodiment or a sixth embodiment of the present disclosure.

Figure 11:
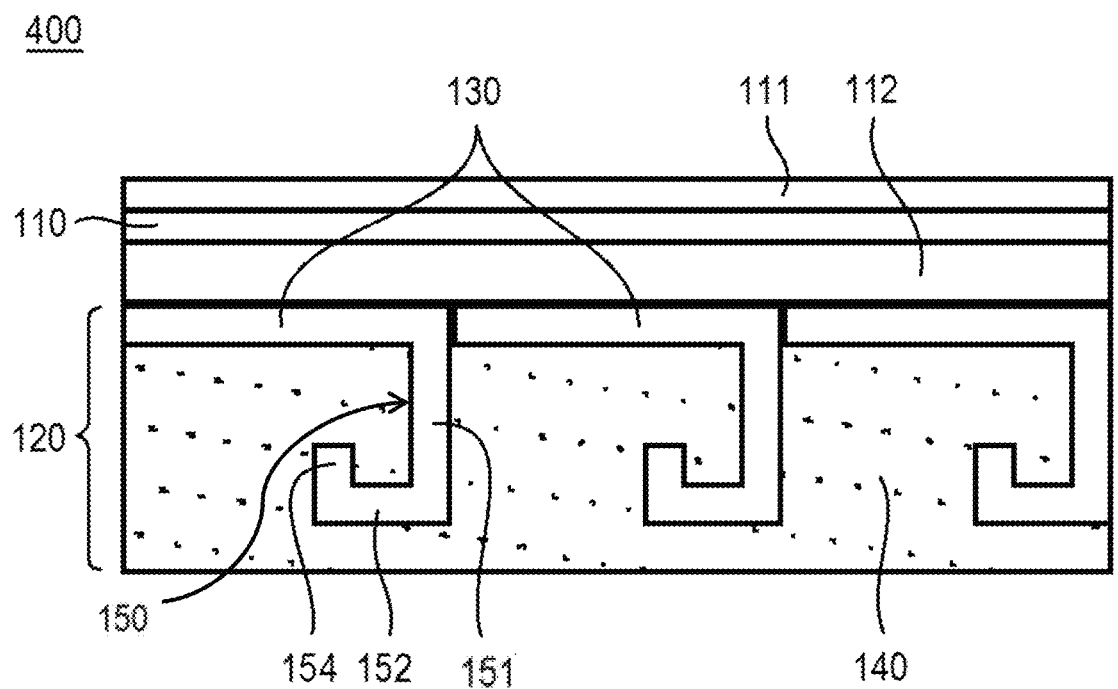
FIG. 11 is a sectional view showing a display device according to a fourth embodiment of the present disclosure.

FIG. 11 is a sectional view showing a display device according to a fourth embodiment of the present disclosure.

Referring to FIG. 11, a display device 400 according to a fourth embodiment of the present disclosure is configured such that support units 130 are provided at the rear surface of a flexible display panel 110 and such that a restoration unit 150 protrudes from one end of each support unit 130. The support units 130 and the restoration units 150 are formed by dual injection molding together with a resin unit 140.

Each restoration unit 150 includes a protruding member 151 protruding from a corresponding one of the support units 130, a first bent member 152 bent from the end of the protruding member 151 toward one side, and a third bent member 154 bent again from the end of the first bent member 152 toward the support unit 130. Of course, even in the first embodiment, the third bent member may be provided at each of the first and second bent members.

In the case in which the third bent member 154 is provided, as described above, interference of the third bent member 154 with the resin unit 140 as well as the protruding member 151 and the first bent member 152 is further increased, whereby the restoring force is further increased. Consequently, it is possible to more easily restore the bent state of the flexible display panel 110 to a flat state.

Figure 12:
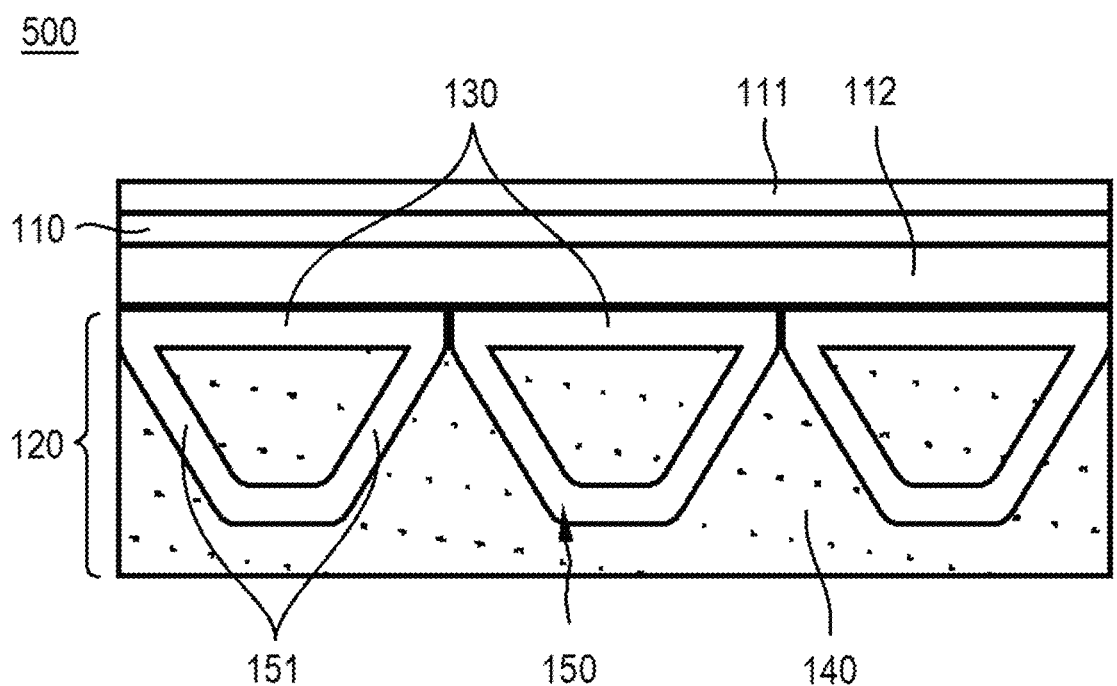
FIG. 12 is a sectional view showing a display device according to a fifth embodiment of the present disclosure.

FIG. 12 is a sectional view showing a display device according to a fifth embodiment of the present disclosure.

Referring to FIG. 12, a display device 500 according to a fifth embodiment of the present disclosure is configured such that support units 130 are provided at the rear surface of a flexible display panel 110 and such that a restoration unit 150 protrudes from opposite ends of each support unit 130. The restoration unit 150 includes two protruding members 151 protruding from the opposite ends of each support unit 130. The support units 130 and the restoration units 150 are formed by dual injection molding together with a resin unit 140.

Each support unit 130 and corresponding protruding members 151 are disposed so as to have a sectional shape approximating a triangle. In the case in which the number of surfaces that connect a protruding member 151 and another protruding member opposite thereto is increased, each support unit 130 and corresponding protruding members 151 may have a sectional shape of a polygon, excluding a triangle. The support units 130 may be disposed closely in tight contact therewith such that no space is formed between the support units 130 and the rear surface of the flexible display panel 110, irrespective of the number of protruding members 151. Consequently, the area of contact between each protruding member 151 and the resin unit 140 is increased, whereby the restoring force of the flexible display panel 110 may be increased.

Figure 13:
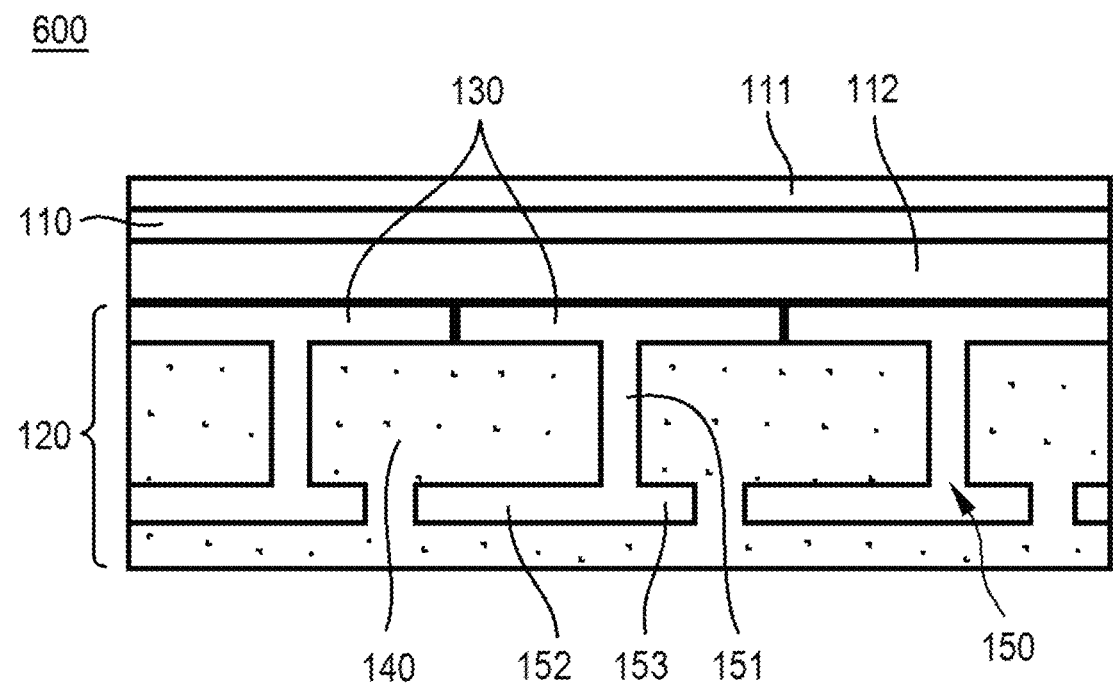
FIG. 13 is a sectional view showing a display device according to a sixth embodiment of the present disclosure.

FIG. 13 is a sectional view showing a display device according to a sixth embodiment of the present disclosure.

Referring to FIG. 13, a display device 600 according to a sixth embodiment of the present disclosure is configured such that support units 130 are provided at the rear surface of a flexible display panel 110 and such that a restoration unit 150 having a protruding member 151 is provided in the middle of each support unit 130. The support units 130 and the protruding members 151 are formed by dual injection molding together with a resin unit 140.

A first bent member 152 is disposed at one side of the end of each protruding member 151, and a second bent member 153 is disposed at the other side of the end of the protruding member 151. The first bent member 152 and the second bent member 153 have different lengths. In addition, one of the first bent member 152 and the second bent member 153 that is longer, e.g., the first bent member 152, extends so as to overlap the rear surface of another support unit adjacent thereto.

As a result, each support unit 130 and another support unit adjacent thereto are disposed to form a predetermined angle therebetween when the flexible display panel 110 is bent. Since the first bent member 152 that is relatively long is disposed so as to overlap a portion that is disposed at the intersection between each support unit 130 and another support adjacent thereto, however, the first bent member 1521 interferes with the resin unit 140 in the state in which each support unit 130 and another support adjacent thereto are disposed to form the predetermined angle. That is, the bent member 1521 that is relatively long overlaps the portion that is disposed at the intersection between each support unit 130 and another support unit adjacent thereto, whereby the first bent member 152 may provide additional restoring force while preventing each support unit 130 and another support unit adjacent thereto from being disposed to form the predetermined angle therebetween.

Consequently, one of the first bent member 152 and the second bent member 153 that is longer has a length greater than half the length of each support so as to partially overlap the rear surface of another support unit adjacent thereto.

As is apparent from the above description, the display device according to the present disclosure has the following effects.

First, the supports and the resin unit are integrally provided at the rear surface of the flexible display panel, whereby the flatness of the flexible display panel is maintained uniformly when the flexible display panel is bent or restored.

Second, when impact is applied to the flexible display panel, only one of the supports does not independently absorb the impact, but the impact is distributed to other supports adjacent thereto and to the resin unit, whereby the impact resistance of the flexible display panel is improved.

Third, the restoration unit, each of which may have any of various structures, is provided on each support, whereby it is possible to easily restore the flexible display panel in the state of being bent.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a plurality of support units contacting side by side on a rear surface of a display panel;
   a plurality of restoration units, each restoration unit protruding from respective support units; and
   a resin unit disposed on and between the plurality of support units and the plurality of restoration units for elastically interconnecting the support units and the restoration units;
   wherein the restoration units are fully embedded within the resin unit,
   wherein the restoration units interfere with the resin unit to restore the display panel to its original position when impact is applied to the display panel.

2. The display device according to claim 1, wherein the restoration unit comprises a protruding member integrally protruding from an edge portion or a middle portion of the rear surface of each support unit.

3. The display device according to claim 2, wherein the restoration unit comprises at least two protruding members provided on the rear surface of each support unit.

4. The display device according to claim 2, wherein the restoration unit comprises a first bent member bent from an end of the protruding member.

5. The display device according to claim 4, wherein the resin unit is disposed to enclose the protruding member and the first bent member.

6. The display device according to claim 2, wherein the restoration unit comprises:
   a first bent member protruding from the protruding member toward one side; and
   a second bent member protruding toward the other side opposite of the first bent member.

7. The display device according to claim 6, wherein the restoration unit further comprises a third bent member protruding further from the first bent member.

8. The display device according to claim 7, wherein the third bent member protrudes from an end of the first bent member towards each support unit.

9. The display device according to claim 6, wherein the first bent member protrudes toward one side being parallel to each support unit, and the second bent member protrudes toward the opposite side being parallel to each support unit.

10. The display device according to claim 6, wherein the first bent member and the second bent member have different lengths, and
    one of the first bent member and the second bent member that is longer has a length greater than half a length of each support unit.

11. The display device according to claim 1, wherein each support unit and the restoration unit are integrally formed by dual injection molding.

12. A display device, comprising:
    a plurality of support units disposed side by side on a rear surface of a display panel;
    a plurality of restoration units, each restoration unit protruding from respective support units; and
    a resin unit disposed on and between the plurality of support units and the plurality of restoration units for elastically interconnecting the support units and the restoration units;
    wherein the restoration units interfere with the resin unit to restore the display panel to its original position when impact is applied to the display panel,
    wherein the restoration unit comprises a protruding member integrally protruding from an edge portion or a middle portion of the rear surface of each support unit, and at least two protruding members provided on the rear surface of each support unit,
    wherein the at least two protruding members and each support unit are integrally provided to form a sectional shape of a polygon comprising at least a triangular shape.

13. A display device, comprising:
    a plurality of support units disposed side by side on a rear surface of a display panel;
    a plurality of restoration units, each restoration unit protruding from respective support units; and
    a resin unit disposed on and between the plurality of support units and the plurality of restoration units for elastically interconnecting the support units and the restoration units;
    wherein the restoration units interfere with the resin unit to restore the display panel to its original position when impact is applied to the display panel,
    wherein the restoration unit comprises:
       a protruding member integrally protruding from an edge portion or a middle portion of the rear surface of each support unit;
       a first bent member protruding from the protruding member toward one side; and
       a second bent member protruding toward the other side opposite of the first bent member,
    wherein at least one of the first bent member or the second bent member extends to partially crossover to an adjacent support unit of the plurality.

* * * * *